(12) United States Patent
Duffner (10) Patent No.: US 8,902,693 B2
(45) Date of Patent: Dec. 2, 2014

(54) SYSTEM AND METHOD FOR PER-BIT DE-SKEW FOR DATAMASK IN A DOUBLE DATA-RATE MEMORY DEVICE INTERFACE

(71) Applicant: Avago Technologies General IP (Singapore) Pte. Ltd., Singapore (SG)

(72) Inventor: Barbara Jean Duffner, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 35 days.

(21) Appl. No.: 13/870,880

(22) Filed: Apr. 25, 2013

(65) Prior Publication Data

US 2014/0321229 A1 Oct. 30, 2014

(51) Int. Cl.
- *G11C 7/22* (2006.01)
- *G11C 11/4076* (2006.01)
- *G11C 11/408* (2006.01)

(52) U.S. Cl.
CPC .......... *G11C 11/4076* (2013.01); *G11C 11/408* (2013.01)
USPC .................................. 365/233.13; 365/233.1

(58) Field of Classification Search
CPC ............ G11C 7/222; G11C 8/18; G11C 7/22; G11C 7/1066; G11C 29/023; G11C 7/1093; G11C 29/028; G11C 11/4076; G11C 2207/2254; G11C 7/1051; G11C 7/109; G11C 2207/2272; G11C 29/022; G11C 7/1072; H01L 2224/73265; H01L 2924/00; H01L 2224/32225; H01L 2924/15311; H01L 2924/00012; H01L 2224/32145; H01L 2224/48091; H01L 2924/10253; H01L 2924/3011; H01L 2224/16145; H01L 25/0657

See application file for complete search history.

(56) References Cited

U.S. PATENT DOCUMENTS

| | | |
|---|---|---|
| 6,600,681 B1 | 7/2003 | Korger et al. |
| 7,170,818 B2 | 1/2007 | Kyung |
| 8,081,527 B1 | 12/2011 | Venkataraman et al. |

OTHER PUBLICATIONS

Debugging [online]. Altera Corporation, Jul. 2010 [retrieved on Mar. 21, 2013]. Retrieved from the Internet: /www.datasheetarchive.com/pdf/download.php>. Provided with Apr. 25, 2013 IDS.*
External Memory Interface Handbook, vol. 3. [online]. Altera Corporation, Nov. 2012 [retrieved on Mar. 20, 2013]. Retrieved from the Internet: <http://www.altera.com/literature/hb/external-memory/emi_ip.pdf>.
Debugging [online]. Altera Corporation, Jul. 2010 [retrieved on Mar. 21, 2013]. Retrieved from the Internet: <http://www.datasheetarchive.com/pdf/download.php>.
External Memory Interface Handbook, vol. 2, DDR2 and DDR3 SDRAM Board Design Guidelines [online]. Altera Corporation, Nov. 2012 [retrieved on Mar. 21, 2013]. Retrieved from the Internet: <http://www.altera.com/literature/hb/external-memory/emi_plan_board_ddr2.pdf>.

\* cited by examiner

*Primary Examiner* — James G Norman (57) ABSTRACT

In a training mode, per-bit de-skew (PBDS) values for a datamask signal in a synchronous dynamic random access memory are iteratively adjusted in conjunction with writing test patterns to the memory and reading back test patterns from the memory until optimum datamask PBDS values are determined.

27 Claims, 4 Drawing Sheets

FIG. 2

| POSITION OF DATA WORD IN BURST: | 0 | 1 | 2 | 3 | 4 | 5 | 6 | 7 |
|---|---|---|---|---|---|---|---|---|
| ALL-UNMASKED DATAMASK: | 0 | 0 | 0 | 0 | 0 | 0 | 0 | 0 |
| AFTER WRITING PATTERN_A USING ALL-UNMASKED DATAMASK: | A0 | A1 | A2 | A3 | A4 | A5 | A6 | A7 |

FIG. 3A

| POSITION OF DATA WORD IN BURST: | 0 | 1 | 2 | 3 | 4 | 5 | 6 | 7 |
|---|---|---|---|---|---|---|---|---|
| EXAMPLE PATTERN_DM AS DATAMASK: | 0 | 1 | 0 | 0 | 1 | 1 | 0 | 0 |
| AFTER WRITING PATTERN_B USING PATTERN_DM AS DATAMASK: | B0 | A1 | B2 | B3 | A4 | A5 | B6 | B7 |

SYSTEM AND METHOD FOR PER-BIT DE-SKEW FOR DATAMASK IN A DOUBLE DATA-RATE MEMORY DEVICE INTERFACE

BACKGROUND

As computers and computer processors increase in performance, memory access performance becomes a significant factor affecting overall system performance. If an interface that communicates data between a memory device and a memory controller or other application device operates more slowly than a processor can use data, the interface can reduce the data processing capacity of the entire computer. For dynamic random access memory (DRAM) devices, which are commonly used as the main working memory for a computer, various interconnect technologies have been developed over the years. One such interconnect technology is used for synchronous DRAMs, or SDRAMs, which utilize a source synchronous interface, where the source of data during a data transfer is relied upon to provide a data strobe signal (DQS) that is used by the target of the data transfer to capture such data as it is being transferred over a data line to the target. In particular, the capture of data on a data line is typically latched by the rising or falling edge of the DQS signals, for example, so that the value transmitted on a data line when the data strobe signal transitions from low to high, or vice-versa, will be latched into a data latch in the target.

DRAM memory elements, such as double data rate (DDR) memory elements, contain multiple buses. A command and address bus is formed by a number of signals, such as, for example, a column-address strobe (CAS), row-address strobe (RAS), write enable (WE), clock enable (CKE), chip-select (CS), address (ADDR), bank address (BA) signals, and differential clock signals (CK and CKN). The data bus contains the data signals (DQ), and the source synchronous strobes (DQS and DQSN). DDR3 memory elements operate with differential data strobes DQS and DQSN, which enable source-synchronous data capture at twice the clock frequency. Data is registered with the rising edge of DQS and DQSN signals. The data bus of some types of DDR memory elements also include datamask (DM) signals that are used for masking selected bits during a write operation.

DDR3 data is transferred in bursts for both read and write operations, sending or receiving a series of four (referred to as burst chop 4 or BC4) or eight (referred to as burst length 8 or BL8) data words with each memory access. For read operations, data bursts of various lengths are transmitted by the DRAM device edge-aligned with a strobe. For write operations, data bursts of various lengths are received by the DRAM element with a 90-degree phase-delayed data strobe signal. The strobe signal is a bidirectional signal used to capture data. After the data is captured in the source-synchronous strobe domain, the data must be transferred into a local clock domain.

For dual in-line memory modules or DIMMs, the DDR3 memory specification includes what is commonly known as a "flyby" topology for clock, address and control connections that are shared among all the DRAM devices on the DIMM. As opposed to the balanced tree arrangement used in DDR2 memory, which provides clock, address and control signals of approximately the same length to each memory element in a memory module at the expense of signal integrity, the flyby topology is arranged to promote signal integrity and results in clock, address and control connections of different lengths for each device within the module. Consequently, the timing relationships between the data, data strobe and clock signals can vary undesirably from one memory element in the DIMM to another. Since the DDR3 SDRAM devices require a specific timing relationship between the data, data strobe and clock at the respective DRAM pins, the DDR3 specification supports an independent timing calibration known as "write leveling" for each source synchronous group.

Write leveling allows the host logic circuitry that initiates the data transfers (e.g., a core logic portion of an ASIC) to configure the interface that communicates data between the memory controller and the target DRAM to delay the data strobe signal and data signals by a configurable or controllable amount of time. A free-running clock signal, CK, is propagated from the host logic circuitry to an input of a dedicated internal calibration register in a target DRAM. In the write leveling procedure, a single data strobe (DQS) signal pulse is propagated from the host logic circuitry to the dedicated internal calibration register in the DRAM. In response to this single DQS signal pulse, the dedicated internal calibration register outputs a signal that indicates the phase alignment between the clock signal and the data strobe signal rising edge at the DQ pin of the DRAM. This output is propagated back to the host on one or more of the data signal (DQ) lines to the memory controller. The calibration is repeated with different delay values until an optimum write-leveling delay is determined. The host logic circuitry can then configure the interface to use the optimized write-leveling delay for subsequent write operations from the memory controller to the target DRAM.

Although the above-described write leveling calibration or training procedure can be used to phase-align the data strobe signal with respect to the clock signal at the DRAM pins, write leveling does not affect phase alignment between the data strobe signal and the data signals at the DRAM pins. Another calibration system and procedure, sometimes referred to as "per-bit de-skew" or PBDS, has been developed to phase-align each data (bit) signal with the data strobe signal at the DRAM pins. That is, PBDS allows the host logic circuitry to configure the interface to delay a data signal on a selected data line within a source synchronous group by a configurable or controllable amount of time with respect to the data strobe signal. In the PBDS calibration or training procedure, the host logic circuitry performs a number of write operations to a target DRAM, setting a skew value for the selected data line to a different value on each write operation and then reading back the data that was written. A match between the data that was written and the data that was read back indicates that the skew value aligned the selected data bits with the strobe to an extent sufficient to meet DRAM setup and hold requirements. PBDS is generally used to meet the more stringent timing requirements of higher-speed (e.g., greater than 1.3 Mtps) interfaces where differences among data signals and the data strobe signal can be a significant percentage of the clock period.

Datamask is a feature of DDR3 DRAM that the host logic circuitry can use during a write operation to mask selected memory locations. To use the datamask feature, the host logic circuitry outputs a mask signal along with the data word to be written. A logic-0 value on the mask signal indicates that the DRAM is to write a data word to the corresponding word position in the DRAM memory. A logic-1 value on the mask signal indicates that the DRAM is not to write a data word to the corresponding word position in the DRAM memory, thereby preserving the value of that word in the DRAM. Like data signals, datamask signals are configurable using PBDS. That is, the host logic circuitry can configure the interface to delay a selected line of the datamask signal within a source synchronous group by a configurable or controllable amount of time with respect to the data strobe signal.

SUMMARY

Embodiments of the present invention relate to a system and method for determining or calibrating per-bit de-skew (PBDS) values for datamask (DM) signal lines in a dynamic random access memory (DRAM) interface. In an exemplary embodiment, the method includes: (a) setting a PBDS value for a DM signal line of the interface; (b) sequentially providing a plurality of initial DM values to the DRAM memory using the DM signal line, each initial DM value of the plurality of initial DM values representing an unmasked state; (c) sequentially writing a plurality of first write data values to a corresponding plurality of DRAM locations in synchronism with step (b) using a data signal line group corresponding to the DM signal line, each initial DM value defining an unmasked DRAM location of the plurality of DRAM locations, the interface delaying signals representing the initial DM values on the DM signal line by an amount of time corresponding to the PBDS value; (d) sequentially providing a plurality of DM values to the DRAM memory using the DM signal line, at least one DM value of the plurality of DM values representing a masked state and at least another DM value of the plurality of DM values representing an unmasked state; (e) sequentially writing a plurality of second write data values different from the plurality of first write data values to a corresponding plurality of DRAM locations in synchronism with step (d) using the data signal line group corresponding to the DM signal line, each DM value representing a masked state defining a masked DRAM location of the plurality of DRAM locations, each DM value representing an unmasked state defining an unmasked DRAM location of the plurality of DRAM locations, the interface delaying signals representing the DM values on the DM signal line by an amount of time corresponding to the PBDS value; (f) reading a plurality of read data values from the plurality of DRAM locations following step (e); (g) determining if each read data value read from a masked DRAM location matches a first write data value written to the masked DRAM location and each read data value read from an unmasked DRAM location matches a second write data value written to the unmasked DRAM location; (h) setting the PBDS value for the DM signal line to another value; and (i) iteratively repeating steps (b)-(h) with the PBDS value for the DM signal line set to each of a plurality of different PBDS values within a range of PBDS values.

In the exemplary embodiment, a system for determining PBDS values for DM signal lines in a DRAM interface comprises a first write data register configured for storing a plurality of first write data values, a second write data register configured for storing a plurality of second write data values different from the plurality of first write data values, a DM register configured for storing a plurality of DM values, comparator logic, and control logic. The control logic is programmed or otherwise configured to effect the steps of: (a) setting a PBDS value for a DM signal line of the interface; (b) sequentially providing a plurality of initial DM values to the DRAM memory using the DM signal line, each initial DM value of the plurality of initial DM values representing an unmasked state; (c) sequentially writing the plurality of first write data values from the first write data register to a corresponding plurality of DRAM locations in synchronism with step (b) using a data signal line group corresponding to the DM signal line, each initial DM value defining an unmasked DRAM location of the plurality of DRAM locations, the interface delaying signals representing the initial DM values on the DM signal line by an amount of time corresponding to the PBDS value; (d) sequentially providing the plurality of DM values from the DM register to the DRAM memory using the DM signal line, at least one DM value of the plurality of DM values representing a masked state and at least another DM value of the plurality of DM values representing an unmasked state; (e) sequentially writing the plurality of second write data values from the second write data register to a corresponding plurality of DRAM locations in synchronism with step (d) using the data signal line group corresponding to the DM signal line, each DM value representing a masked state defining a masked DRAM location of the plurality of DRAM locations, each DM value representing an unmasked state defining an unmasked DRAM location of the plurality of DRAM locations, the interface delaying signals representing the DM values on the DM signal line by an amount of time corresponding to the PBDS value; (f) reading a plurality of read data values from the plurality of DRAM locations following step (e); (g) the comparator logic determining if each read data value read from a masked DRAM location matches a first write data value written to the masked DRAM location and each read data value read from an unmasked DRAM location matches a second write data value written to the unmasked DRAM location; (h) setting the PBDS value for the DM signal line to another value; and (i) iteratively repeating steps (b)-(h) with the PBDS value for the DM signal line set to each of a plurality of different PBDS values within a range of PBDS values.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

DETAILED DESCRIPTION

Figure 1:
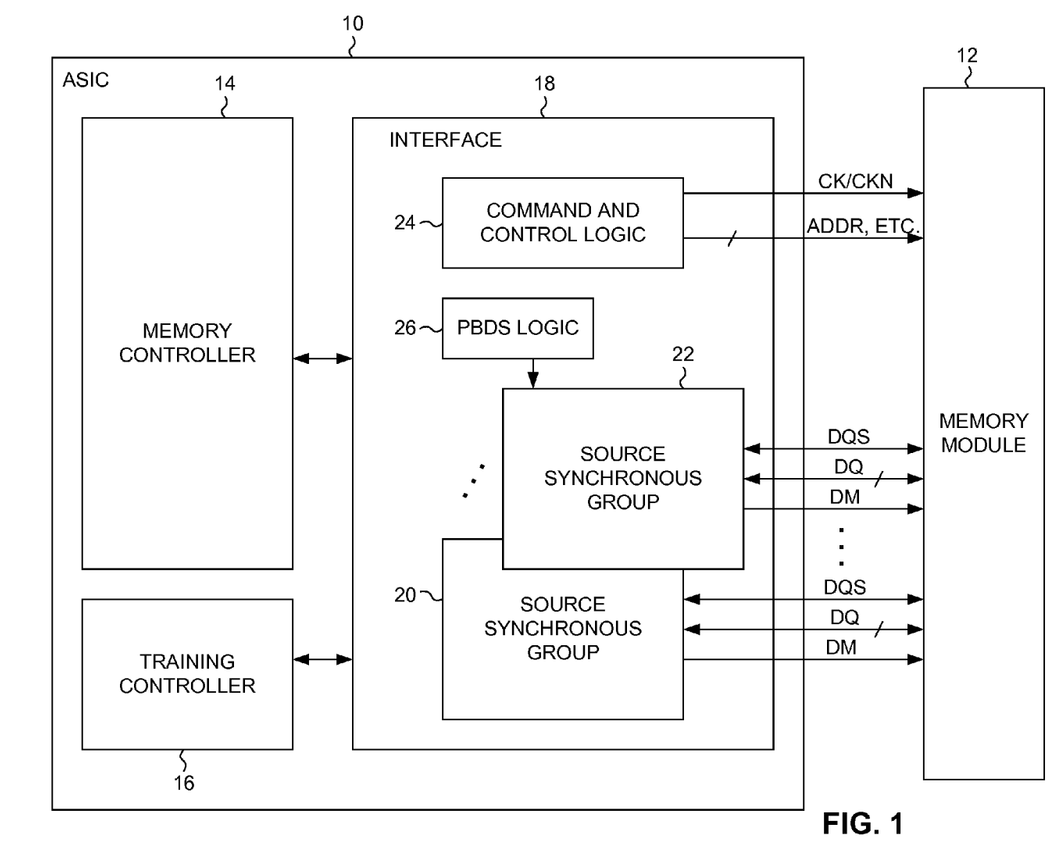
FIG. 1 is a block diagram of an application-specific integrated circuit having a training controller system for setting per-bit de-skew (PBDS) values for datamask (DM) signal lines in a dynamic random access memory (DRAM) interface, in accordance with an exemplary embodiment of the invention.

As illustrated in FIG. 1, in an illustrative or exemplary embodiment of the invention, an application-specific integrated circuit (ASIC) 10 is interfaced with a double data rate (DDR) dynamic random access memory (DRAM) module 12. DRAM module 12 can comprise any suitable type of commercially available DDR3 or similar DRAM. The ASIC 10 includes, among other elements (not shown for purposes of clarity), a memory controller 14, a training controller 16, and an interface 18. As the structure and operation of interface 18 conform to the specifications published by the DRAM manufacturer, providing a suitable interface 18 is well within the capabilities of one of ordinary skill in the art. Accordingly, details of interface 18 are not described herein. Rather, for purposes of the exemplary embodiment described herein, it is sufficient to note that interface 18 includes a number of (e.g., two or more) source-synchronous groups 20, 22, etc., and command and control logic 24. Each source-synchronous group 20, 22, etc. communicates a group of bidirectional data signals (DQ) and a bidirectional data strobe signal (DQS) with DRAM module 12, as well as provides a datamask signal (DM) to DRAM module 12. In the exemplary embodiment, each group of data signals consists of eight signal lines, so that data can be communicated between each source-synchronous group 20, 22, etc., and DRAM module 12 in the form of 8-bit words. In the exemplary embodiment, read and write operations are performed in bursts of, for example, eight such 8-bit words, provided sequentially and communicated between one of the source-synchronous groups 20, 22, etc., and DRAM module 12. Nevertheless, in other embodiments such read and write operations can be performed using any number of bursts of any valid length, and for any number of source synchronous groups.

In response to a write command received from memory controller 14, interface 18 provides data signals that represent a burst of data to be written to DRAM 12 and generates a data strobe signal having the required timing relationship (i.e., phase alignment) to the data signals. In response to a read command received from memory controller 14, interface 18 receives data signals and a strobe signal from memory module 12. Memory controller 14 can, in some instances, provide a request to mask specified groups of the data signals in conjunction with a write command. Interface 18 responds to such mask information by generating datamask signals that are phase-aligned with the data signals it generates. Although not shown for purposes of clarity, each source-synchronous group 20, 22, etc., also includes conventional write-leveling logic that ensures the data strobe signal is phase-aligned with the rising edge of the clock signal (CK) during a write operation. Generally, the write-leveling logic aligns the data strobe signal such that its rising edge is aligned with the CK input pin of DRAM module 12.

Interface 18 further includes per-bit de-skew (PBDS) logic 26. In response to PBDS control signals, PBDS logic 26 can adjust the relative timing between the data strobe signal and the data signals of a source-synchronous group 20, 22, etc., as well as the relative timing between the data strobe signal and the datamask signal of a source-synchronous group 20, 22, etc. In the exemplary embodiment, training controller 16 provides these PBDS control signals to interface 18 during a training phase of operation, in which the source-synchronous group timing 20, 22, etc. is configured or "trained" in response to feedback, as described in further detail below. The objective of this training is generally to ensure that setup and hold time requirements for a write or read operation are satisfied.

Figure 2:
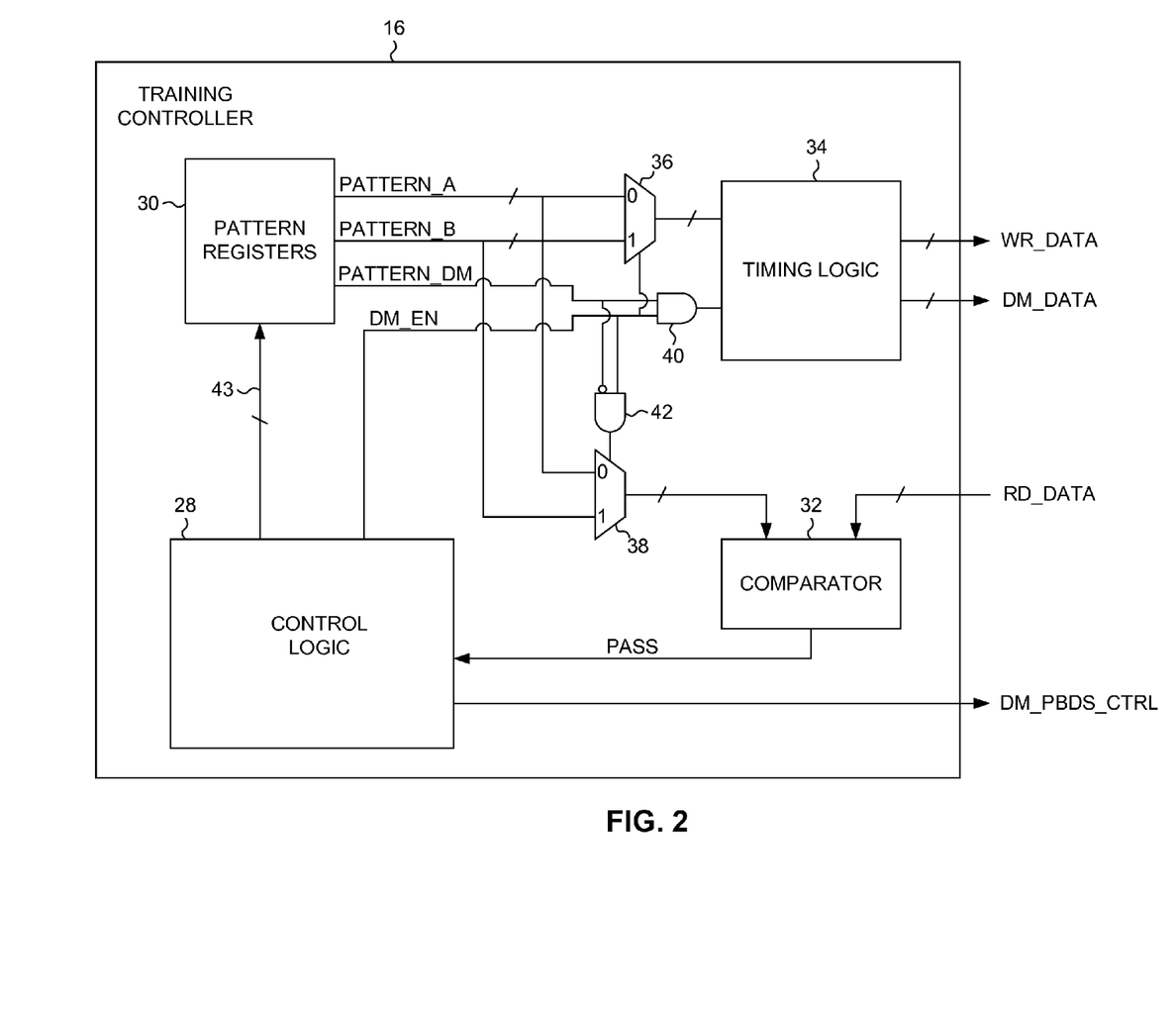
FIG. 2 is a block diagram of the training controller system of FIG. 1.

As illustrated in FIG. 2, during the training phase, training controller 16 provides write data (WR_DATA) and datamask information (DM_DATA) to interface 18 (FIG. 1) and receives read data (RD_DATA) from interface 18. As a result of the training phase, training controller 16 provides datamask PBDS control signals (DM_PBDS_CTRL) to interface 18. Although not shown for purposes of clarity, training controller 16 also includes logic that is employed during the training phase to provide data signal PBDS control signals to interface 18. In response to such data signal PBDS controls signals, interface 18 adjusts or configures the timing of data signals (DQ) relative to the data strobe (DQS) signal during write operations. Similarly, in response to the datamask PBDS control signals, interface 18 adjusts or configures the timing of datamask (DM) signal relative to the data strobe (DQS) signal during write operations. The datamask PBDS control signals identify a source-synchronous group and represent an amount of time by which interface 18 is to delay the datamask signal it provides to DRAM module 12. Training controller 16 can set the datamask PBDS control signals to represent a selected delay within a range between a minimum value and a maximum value. Training controller 16 can set the datamask PBDS control signals to represent a selected delay in increments of a predetermined amount, such as, for example, 10ps. Thus, training controller 16 can set the datamask PBDS control signals to represent a selected delay of, for example, zero, 10 ps, 20 ps, etc, up to a predetermined maximum. For purposes of this description, the term "increment" includes within its scope of meaning decrement, i.e., a negative increment.

Interface 18 can multiplex or select between communicating the above-described signals with training controller 16 during the training phase and communicating similar signals with memory controller 14 (FIG. 1) following the training phase. More specifically, during the training phase, interface 18 receives write data (WR_DATA) and datamask information (DM_DATA) from training controller 16 and provides read data (RD_DATA) to training controller 16. Following the training phase, interface 18 receives data similarly to be written to DRAM 12 (along with datamask information) from memory controller 14 and provides data similarly read from DRAM 12 to memory controller 14. Logic embodying such a signal multiplexing or selection function is not shown for purposes of clarity.

In the exemplary embodiment, training controller 16 can include control logic 28, pattern registers 30, a comparator 32 and timing logic 34, as well as suitable additional logic such as two multiplexers 36 and 38 and two logic gates 40 and 42. Pattern registers 30 store bit patterns that are used during the training method. Pattern registers 30 store data for at least an entire burst. These bit patterns can be similar to those used conventionally for testing memories. As persons skilled in the art appreciate, typical test patterns include a mix of logic-1 and logic-0 values, such as alternating logic-1s and logic-0s (e.g., '01010101') and alternating groups of multiple logic-1s and logic-0s (e.g., '00110011', '00001111', '11110000', etc.). Patterns consisting of all logic-1s ('11111111') or all logic-0s ('00000000') may be useful, but generally to a lesser extent than the foregoing mixed patterns. Persons skilled in the art will be readily capable of selecting suitable patterns for use in the method described herein.

Pattern registers 30 can store at least one first write data pattern (PATTERN_A) comprising a plurality of first write data values, at least one second write data pattern (PATTERN_B) comprising a plurality of second write data values that are different from the first write data values, and at least one datamask pattern (PATTERN_DM) comprising a plurality of datamask values. Preferably, pattern registers 30 can store several different such first write data patterns, second write data patterns and datamask patterns. For example, pattern registers 30 can store the first write data patterns in the form of N*M 8-bit words, where the N 8-bit words represent one first write data pattern, where N is the number of words per burst (e.g., eight in the exemplary embodiment), and M is the number of bursts per write operation (which can be any suitable number). The eight 8-bit words (write data values) of the first write data pattern can be represented as: A0, A1, A2, A3, A4, A5, A6 and A7. Similarly, pattern registers 30 can store the second write data patterns in the form of N*M 8-bit words, where the N 8-bit words represent one second write data pattern. The eight 8-bit words (write data values) of the second write data pattern can be represented as: B0, B1, B2, B3, B4, B5, B6 and B7. Likewise, pattern registers 30 can store the datamask patterns in the form of N*M bits. Control logic 28 can provide suitable control signals 43 that cause pattern register 30 to select a combination of the stored patterns during a write operation. During a write operation, the eight words (write data values) of the selected write pattern are written sequentially via a source-synchronous group 20, 22, etc. For purposes of clarity, only the operation of one source-synchronous group 20, 22, etc., is described below. However, it should be understood that all of the (two or more) source synchronous groups 20, 22, etc., operate in the manner described, and in parallel with each other. It should be noted that although not shown for purposes of clarity in FIG. 2, each of multiplexers 36 and 38 has 16 individual input signal lines and eight individual output signal lines. Similarly, it should be noted that in the exemplary embodiment the write data (WR_DATA), and read data (RD_DATA) are each eight bits wide. Logic gates 40 and 42 receive each bit of the datamask pattern serially, and each produces a single bit output.

Figure 3A:
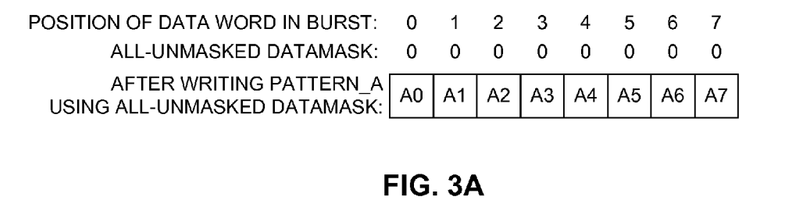
FIG. 3A illustrates a result of writing a burst of data to DRAM locations using all-unmasked DM values.
Figure 3B:
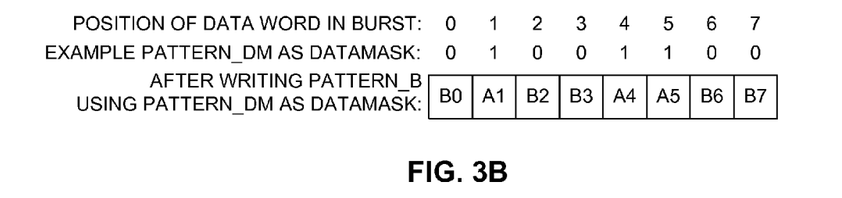
FIG. 3B illustrates a result of subsequently writing a burst of data to DRAM locations using an exemplary datamask test pattern.
Figure 3C:
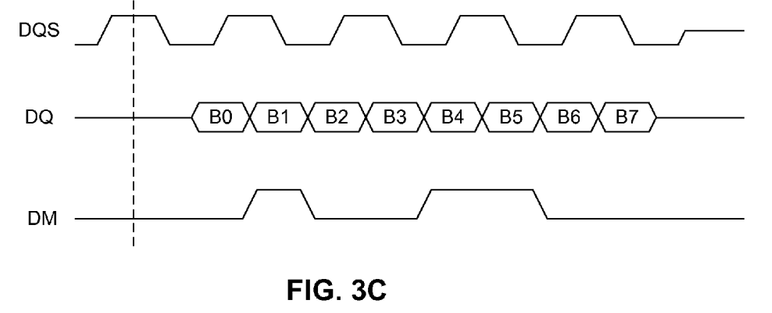
FIG. 3C is a timing diagram illustrating writing the burst of data of FIG. 3B.

An example of an instance in which data is written to a memory location in DRAM module 12 using datamask information is shown in FIGS. 3A-C. In this example, the first data pattern (PATTERN_A) is represented by words or first write data values A0 through A7 that are to be written sequentially in a burst to DRAM module 12 via one of source-synchronous groups 20, 22, etc. Training controller 16 initiates a write operation to write at least one burst of eight first data values to eight memory locations using '00000000' as an initial datamask pattern. Note in FIG. 3A the corresponding temporal positions ("Position of Data Word in Burst") in the write burst between the eight first write data values and eight (all logic-0) data mask values. As all bits or datamask values of the datamask pattern '00000000' are logic-0, all of the eight corresponding memory locations are in an unmasked state during the write burst. Accordingly, after this write operation is completed, the memory location in DRAM module 12 contains the eight first data values A0 through A7. Thus, any data that had previously been stored in that location in DRAM 12 is overwritten with the first write data pattern (PATTERN_A).

As illustrated in FIG. 3B, in this example, a second exemplary datamask pattern, PATTERN_DM, is: '01001100'. The second data pattern (PATTERN_B) is represented by words or second write data values B0 through B7 that are to be written sequentially in a burst to DRAM module 12 via one of source-synchronous groups 20, 22, etc. Training controller 16 initiates a second write operation to write at least one burst of eight sequential second data values to the same above-referenced eight memory locations using the second data mask pattern ('01001100' in this example). Note in FIG. 3B the corresponding temporal positions ("Position of Data Word in Burst") in the write burst between the eight second write data values and eight data mask values. It should also be noted that each logic-1 bit or datamask value serves to mask the corresponding memory location from being written to, while each logic-0 bit or datamask value serves to leave the corresponding memory location unmasked. As the bits or datamask values in temporal positions 1, 4 and 5 of the datamask pattern '0100100' during the write burst are logic-1, the three corresponding memory locations are in a masked state during the write burst. As the bits or datamask values in temporal positions 0, 2, 3, 6 and 7 of the datamask pattern '0100100' during the write burst are logic-0, the five corresponding memory locations are in an unmasked state during the write burst. Accordingly, after this second write operation is completed, only the unmasked memory locations in DRAM module 12 contain corresponding second write data values of the second data pattern. The masked memory locations in DRAM module 12 still contain corresponding first write data values of the first data pattern. Stated another way, after this second write operation, each data value stored in a masked DRAM location matches the first write data value that was written to that DRAM location, and each data stored in an unmasked DRAM location matches the second write data value that was written to that DRAM location. The exemplary instance illustrated by FIGS. 3A-B is based on a presumption that proper setup and hold times exist between the datamask signals and data strobe signals. The training method described below helps ensure that such proper setup and hold times exist.

Figure 4:
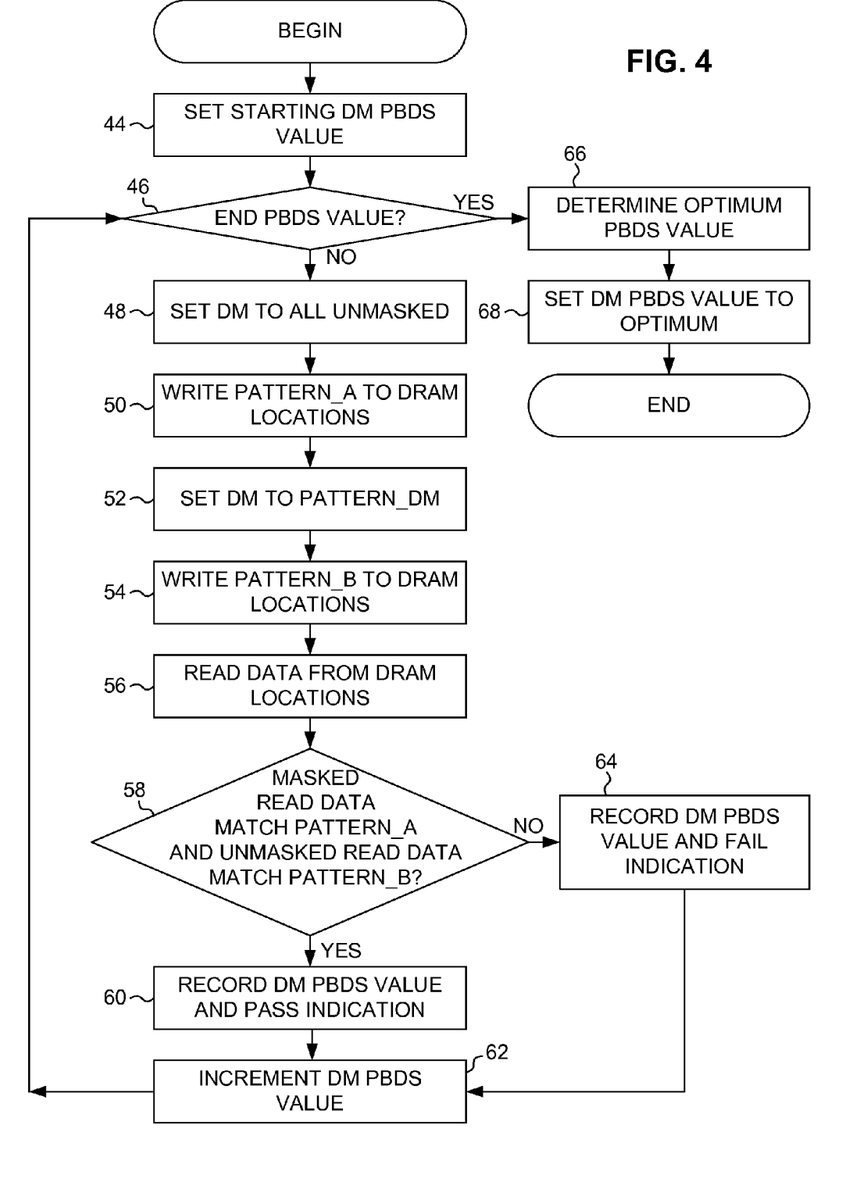
FIG. 4 is a flow diagram illustrating a method for setting PBDS values for DM signal lines in a DRAM interface, in accordance with the exemplary embodiment of the invention.

As illustrated by the flow diagram of FIG. 4, a datamask PBDS training method can be performed under the control of training controller 16. Control logic 28 of training controller 16 can include a programmable microcontroller or similar logic that can be programmed to effect sequential steps. In view of the flow diagram of FIG. 4 and corresponding description herein, persons skilled in the art will be capable of programming or otherwise configuring control logic 28 to effect such steps. The training method can be initiated at any suitable time by any suitable means, such as in response to the power-up of ASIC 10 or in response to a system reset signal (not shown). Although in the exemplary embodiment training controller 16 is described for purposes of clarity as being a separate element from memory controller 14, in other embodiments (not shown) the logic attributed herein to training controller 16 and memory controller 14 can be included together in the same memory controller. More generally, the logic attributed in the exemplary embodiment to two or more separately identifiable logic elements can, in other embodiments, exist in aggregated form within a single logic element. Conversely, logic attributed in the exemplary embodiment to a single logic element can, in other embodiments, exist in distributed form among two or more logic elements.

Prior to performing the datamask PBDS method, training controller 16 may perform a conventional data PBDS method to ensure that all of the data lines (DQ) are properly phase-aligned with the data strobe (DQS) signal at the input pins to DRAM module 12. As noted above, the logic through which training controller 16 performs such a conventional data PBDS method is not shown for purposes of clarity.

The method illustrated by the flow diagram of FIG. 4 is performed in an iterative manner, with control logic 28 setting the datamask PBDS control signal (DM_PBDS_CTRL) to a different value during each iteration. As indicated by block 44, on the first iteration control logic 28 initializes the datamask PBDS control signal to a starting or initial value, such as the minimum delay value. As indicated by block 46, control logic 28 determines whether the datamask PBDS control signal has been set to an ending value, such as the maximum delay value. As described below, control logic 28 sets the datamask PBDS control signal to such an ending value during a final iteration. If the PBDS value has not reached the ending value, the method proceeds to block 48.

As indicated by block 48, training controller 16 sets the datamask pattern to a value that represents all unmasked groups: '00000000'. Referring briefly again to FIG. 2, in the exemplary embodiment control logic 28 can cause the datamask pattern to be set in this manner by setting a datamask enable (DM_EN) signal to a logic-0 or low state. In response to a low datamask enable signal, logic gate 40 outputs a logic-0 signal, which timing logic 34 uses to generate the datamask information (DM_DATA) that it provides to interface 18 in association with a write burst. Also in response to a low datamask enable signal, multiplexer 36 selects the first data pattern (PATTERN_A) output of pattern registers 30. Through multiplexer 36, timing logic 34 collects eight words of the first data pattern from pattern registers 30. A single-burst write operation is sufficient for the testing purposes described herein, but it is suitable for a write operation to comprise any number of bursts. Timing logic 34 aligns the write data words and datamask information in a manner that ensures these signals are properly received by interface 18 during the write operation. Note that in the exemplary embodiment shown in FIGS. 1-2, in which there are multiple source synchronous groups 20, 22, etc., datamask PBDS training is performed on the datamask signal for each source synchronous group. A single training controller 16 may be shared among all the source synchronous groups 20, 22, etc.

As indicated by block 50, control logic 28 initiates a write operation through interface 18 that causes the eight words of the first data pattern (PATTERN_A) to be written to eight corresponding memory locations in DRAM module 12. As the datamask pattern represents all memory locations in an unmasked state, the write operation results in the memory locations containing those eight words of the first data pattern. With respect to the exemplary embodiment, the term "memory location" refers to a portion of DRAM module 12 capable of storing a data word. Nevertheless, the term "memory location" can more generally encompass any number of one or more data words.

As indicated by block 52, training controller 16 then selects a datamask pattern (PATTERN_DM) stored in pattern registers 30. Referring again briefly again to FIG. 2, in the exemplary embodiment control logic 28 sets the datamask enable (DM_EN) signal to a logic-1 or high state. In response to a high datamask enable signal, logic gate 40 outputs a logic-1 signal for each bit of the datamask pattern that is high or logic-1 and outputs a logic-0 signal for each bit of the datamask pattern that is low or logic-0. Also in response to a high datamask enable signal, multiplexer 36 selects the second data pattern (PATTERN_B) output of pattern registers 30. Through multiplexer 36, timing logic 34 collects eight words of the second data pattern from pattern registers 30. Timing logic 34 provides these eight write data words (WR_DATA) to interface 18 for inclusion in a write burst. Timing logic 34 provides the eight words of the second data pattern (PATTERN_B) and the datamask pattern (PATTERN_DM) as the write data words (WR_DATA) and datamask information (DM_DATA), respectively, that timing logic 34 provides to interface 18 for inclusion in a write burst. Timing logic 34 aligns this write data word and datamask information in a manner that ensures they are properly received by interface 18 during the write operation.

As indicated by block 54, control logic 28 initiates a write operation through interface 18 that causes the eight data words of the second data pattern (PATTERN_B) to be written to the same eight memory locations in DRAM module 12 to which the eight data words of the first data pattern were written in accordance with block 50. Accordingly, so long as the required setup and hold times are provided, only those second write data values of the second data pattern that are in unmasked positions will over-write the first write data values of the first data pattern that were stored in the corresponding memory locations in accordance with block 50. Those memory locations that are masked will be protected against being overwritten, and thus continue to store the corresponding first write data values of the first data pattern that were stored there in accordance with block 50.

Then, as indicated by block 56, control logic 28 initiates a read operation through interface 18 that causes data (RD_DATA) to be read from the same memory locations in DRAM module 12 as those to which the first data pattern was written in accordance with block 50 and the second data pattern was written in accordance with block 54. So long as the required setup and hold times are provided, the result described above with regard to FIGS. 3A-B should be achieved. That is, so long as the required setup and hold times are provided, each data value in a DRAM location that was in a masked state during the preceding write operation will match the first write data value that was written to that DRAM location, and each data value in a DRAM location that was in an unmasked state during the preceding write operation will match the second write data value that was written to that DRAM location.

If, as indicated by block 58, control logic 28 determines that each data value read from a masked DRAM location matches the first write data value that was written to that DRAM location and each data value read from an unmasked DRAM location matches the second write data value that was written to that DRAM location, then the test is deemed to have passed. As indicated by block 60, control logic 28 stores or records an indication that the test has passed, along with the corresponding datamask PBDS value (DM_PBDS_CTRL) that was most recently set. Then, as indicated by block 62, control logic 28 increments that datamask PBDS value in preparation for the next iteration of the above-described method. For purposes of this description, the term "increment" includes within its scope of meaning decrement, i.e., a negative increment. Accordingly, as an alternative to initially setting the datamask PBDS value (block 44) to a minimum of its range and incrementing it for subsequent iterations, the datamask PBDS value initially can be set to a maximum of its range and decremented for subsequent iterations. The next iteration then begins in the manner described above with regard to block 46.

Referring again to block 58, if control logic 28 determines that at least one data value read from a masked DRAM location does not match the first write data value that was written to that DRAM location or at least one data value read from an unmasked DRAM location does not match the second write data value that was written to that DRAM location, then the test is deemed to have failed. As indicated by block 64, control logic 28 stores or records an indication that the test has failed, along with the corresponding datamask PBDS value that was most recently set.

In some or all further iterations, control logic 28 can select (blocks 48 and 52) a different datamask pattern (PATTERN_DM) from among those stored in pattern registers 30. Similarly, in some or all further iterations, control logic 28 can select (blocks 48 and 50) a different first data pattern (PATTERN_A) from among those stored in pattern registers 30 to be written to the DRAM locations. Likewise, in some or all further iterations, control logic 28 can select (blocks 48 and 54) a different second data pattern (PATTERN_B) from among those stored in pattern registers 30 to be written to the DRAM locations.

If during any iteration control logic 28 determines, as indicated by block 46, that the PBDS value has been incremented to the maximum of its range (or, alternatively, decremented to the minimum of its range), then control logic 28 determines an optimum datamask PBDS value, as indicated by block 66. Control logic 28 can use the stored test-passed and test-failed indications and corresponding datamask PBDS values to determine the optimum datamask PBDS values. Control logic 28 can determine an optimum datamask PBDS value by determining transitions between two successive iterations in which the test failed in one of the iterations and passed in the other of the iterations, and then select the mid-point between the passing datamask PBDS values at those transitions as the optimum PBDS value.

As the datamask PBDS value is incremented beginning with a minimum value, it can be expected that the test will fail on each iteration in which there is insufficient setup time between the datamask signals (DM) and the data strobe signal (DQS/DQSN) but pass once a transition has been reached at which the datamask PBDS value has been incremented sufficiently to provide sufficient setup time. After that first transition, as the datamask PBDS value is further incremented, it can be expected that the test will continue to pass during each iteration in which there is sufficient setup time between the datamask signals (DM) and the edges of the data strobe signal (DQS/DQSN) but fail once a second transition has been reached at which the datamask PBDS value has been incremented sufficiently to an extent at which there is insufficient hold time between the datamask signals (DM) and the edges of the data strobe signal (DQS/DQSN). Control logic 28 can determine an optimum datamask PBDS value by identifying the minimum and maximum datamask PBDS values for which the test passed, and determining an average of the minimum and maximum datamask PBDS values within the passing range since such an average can be expected to result in both sufficient setup time and sufficient hold time. It should be understood that the above-described method for determining an optimum datamask PBDS value based upon stored values and indications of whether they resulted in the test passing or failing is only one of various methods, and that others will readily occur to persons skilled in the art in view of the teachings herein. For example, other methods may involve a search algorithm that searches for the transitions by setting the datamask PBDS values on successive iterations in a manner that more quickly focuses them toward the values that result in transitions between a passed test and a failed test. Also, although in the exemplary embodiment the mid-point between the minimum and maximum passing datamask PBDS values is determined by averaging those values, in other embodiments the mid-point or a similar point likely to provide sufficient setup and hold times can be determined in any other suitable manner.

As indicated by block 68, control logic 28 can set the datamask PBDS value to the optimum value in preparation for ASIC 10 switching from the training mode to a normal operational mode. The term "normal operational mode" as used herein refers to a mode in which ASIC 10 performs its main function or mission. As described above, in the normal operational mode of ASIC 10, training controller 16 is not active. Rather, in the normal operational mode ASIC 10 performs read and write operations with memory module 12 through memory controller 14.

It should be noted that the invention has been described with respect to illustrative embodiments for the purpose of describing the principles and concepts of the invention. The invention is not limited to these embodiments. As will be understood by those skilled in the art in view of the description being provided herein, many modifications may be made to the embodiments described herein without deviating from the goals of the invention, and all such modifications are within the scope of the invention.

What is claimed is:

1. A method for determining per-bit de-skew (PBDS) values for datamask (DM) signal lines in a dynamic random access memory (DRAM) interface, comprising:
   (a) setting a PBDS value for a DM signal line of the interface;
   (b) sequentially providing a plurality of initial DM values to the DRAM memory using the DM signal line, each initial DM value of the plurality of initial DM values representing an unmasked state;
   (c) sequentially writing a plurality of first write data values to a corresponding plurality of DRAM locations in synchronism with step (b) using a data signal line group corresponding to the DM signal line, each initial DM value defining an unmasked DRAM location of the plurality of DRAM locations, the interface delaying signals representing the initial DM values on the DM signal line by an amount of time corresponding to the PBDS value;
   (d) sequentially providing a plurality of DM values to the DRAM memory using the DM signal line, at least one DM value of the plurality of DM values representing a masked state and at least another DM value of the plurality of DM values representing an unmasked state;
   (e) sequentially writing a plurality of second write data values different from the plurality of first write data values to a corresponding plurality of DRAM locations in synchronism with step (d) using the data signal line group corresponding to the DM signal line, each DM value representing a masked state defining a masked DRAM location of the plurality of DRAM locations, each DM value representing an unmasked state defining an unmasked DRAM location of the plurality of DRAM locations, the interface delaying signals representing the DM values on the DM signal line by an amount of time corresponding to the PBDS value;
   (f) reading a plurality of read data values from the plurality of DRAM locations following step (e);
   (g) determining if each read data value read from a masked DRAM location matches a first write data value written to the masked DRAM location and each read data value read from an unmasked DRAM location matches a second write data value written to the unmasked DRAM location;
   (h) setting the PBDS value for the DM signal line to another value; and
   (i) iteratively repeating steps (b)-(h) with the PBDS value for the DM signal line set to each of a plurality of different PBDS values within a range of PBDS values.

2. The method of claim 1, wherein:
   step (a) comprises setting a PBDS value for each of a plurality of DM signal lines of the interface;
   step (b) comprises providing a plurality of initial DM value groups;
   step (c) comprises writing a plurality of first write data value groups using a plurality of data signal line groups, each data signal line group corresponding to one of the DM signal lines;
   step (d) comprises providing a plurality of DM value groups;
   step (e) comprises writing a plurality of second write data value groups using the plurality of data signal line groups; and
   step (f) comprises reading a plurality of read data value groups.

3. The method of claim 1, wherein each first write data value of the plurality of first write data values is the complement of one second write data value of the plurality of second write data values.

4. The method of claim 1, further comprising changing the plurality of DM values provided in step (d) before repeating steps (b)-(h).

5. The method of claim 1, further comprising changing the plurality of first write data values in step (c) before repeating steps (b)-(h).

6. The method of claim 1, further comprising changing the plurality of second write data values in step (e) before repeating steps (b)-(h).

7. The method of claim 1, wherein in step (h) setting the PBDS value for the DM signal line to another value comprises incrementing the PBDS value by an increment value during a previous iteration of steps (b)-(h) before a next iteration of steps (b)-(h).

8. The method of claim 7, further comprising:
determining a minimum passing PBDS value, the minimum passing PBDS value being provided in step (d) during the next iteration of steps (b)-(h) wherein it is determined in step (g) that each read data value read from a masked DRAM location matches a first write data value written to the masked DRAM location and each read data value read from an unmasked DRAM location matches a second write data value written to the unmasked DRAM location, and wherein it was determined in step (g) during the previous iteration of steps (b)-(h) that at least one read data value read from a masked DRAM location does not match a first write data value written to the masked DRAM location or at least one read data value read from an unmasked DRAM location does not match a second write data value written to the unmasked DRAM location;
determining a maximum passing PBDS value, the maximum passing PBDS value for each of the plurality of DM signal lines being provided in step (d) during the next iteration of steps (b)-(h) wherein it is determined in step (g) that at least one read data value read from a masked DRAM location does not match a first write data value written to the masked DRAM location and at least one read data value read from an unmasked DRAM location does not match a second write data value written to the unmasked DRAM location, and wherein it was determined in step (g) during the previous iteration of steps (b)-(h) that each read data value read from a masked DRAM location matches a first write data value written to the masked DRAM location and each read data value read from an unmasked DRAM location matches a second write data value written to the unmasked DRAM location; and
determining a mid-point between the minimum passing PBDS value and the maximum passing PBDS value.

9. The method of claim 1, further comprising setting per-bit de-skew (PBDS) values for data signal lines in the DRAM interface before steps (a)-(i).

10. A system for determining per-bit de-skew (PBDS) values for datamask (DM) signal lines in a dynamic random access memory (DRAM) interface, comprising:
a first write data register configured for storing a plurality of first write data values;
a second write data register configured for storing a plurality of second write data values different from the plurality of first write data values;
a DM register configured for storing a plurality of DM values;
comparator logic; and
control logic configured to effect the steps of:
(a) setting a PBDS value for a DM signal line of the interface;
(b) sequentially providing a plurality of initial DM values to the DRAM memory using the DM signal line, each initial DM value of the plurality of initial DM values representing an unmasked state;
(c) sequentially writing the plurality of first write data values from the first write data register to a corresponding plurality of DRAM locations in synchronism with step (b) using a data signal line group corresponding to the DM signal line, each initial DM value defining an unmasked DRAM location of the plurality of DRAM locations, the interface delaying signals representing the initial DM values on the DM signal line by an amount of time corresponding to the PBDS value;
(d) sequentially providing the plurality of DM values from the DM register to the DRAM memory using the DM signal line, at least one DM value of the plurality of DM values representing a masked state and at least another DM value of the plurality of DM values representing an unmasked state;
(e) sequentially writing the plurality of second write data values from the second write data register to a corresponding plurality of DRAM locations in synchronism with step (d) using the data signal line group corresponding to the DM signal line, each DM value representing a masked state defining a masked DRAM location of the plurality of DRAM locations, each DM value representing an unmasked state defining an unmasked DRAM location of the plurality of DRAM locations, the interface delaying signals representing the DM values on the DM signal line by an amount of time corresponding to the PBDS value;
(f) reading a plurality of read data values from the plurality of DRAM locations following step (e);
(g) the comparator logic determining if each read data value read from a masked DRAM location matches a first write data value written to the masked DRAM location and each read data value read from an unmasked DRAM location matches a second write data value written to the unmasked DRAM location;
(h) setting the PBDS value for the DM signal line to another value; and
(i) iteratively repeating steps (b)-(h) with the PBDS value for the DM signal line set to each of a plurality of different PBDS values within a range of PBDS values.

11. The system of claim 10, wherein:
step (a) comprises setting a PBDS value for each of a plurality of DM signal lines of the interface;
step (b) comprises providing a plurality of initial DM value groups;
step (c) comprises writing a plurality of first write data value groups using a plurality of data signal line groups, each data signal line group corresponding to one of the DM signal lines;
step (d) comprises providing a plurality of DM value groups;
step (e) comprises writing a plurality of second write data value groups using the plurality of data signal line groups; and
step (f) comprises reading a plurality of read data value groups.

12. The system of claim 10, wherein each first write data value of the plurality of first write data values is the complement of one second write data value of the plurality of second write data values.

13. The system of claim 10, wherein the control logic is further configured to effect the step of changing the plurality of DM values provided in step (d) before repeating steps (b)-(h).

14. The system of claim 10, wherein the control logic is further configured to effect the step of changing the plurality of first write data values in step (c) before repeating steps (b)-(h).

15. The system of claim 10, wherein the control logic is further configured to effect the step of changing the plurality of second write data values in step (e) before repeating steps (b)-(h).

16. The system of claim 10, wherein in step (h) setting the PBDS value for the DM signal line to another value comprises incrementing the PBDS value by an increment value during a previous iteration of steps (b)-(h) before a next iteration of steps (b)-(h).

17. The system of claim 16, wherein the control logic is further configured to effect the steps of:
determining a minimum passing PBDS value, the minimum passing PBDS value being provided in step (d) during the next iteration of steps (b)-(h) wherein it is determined in step (g) that each read data value read from a masked DRAM location matches a first write data value written to the masked DRAM location and each read data value read from an unmasked DRAM location matches a second write data value written to the unmasked DRAM location, and wherein it was determined in step (g) during the previous iteration of steps (b)-(h) that at least one read data value read from a masked DRAM location does not match a first write data value written to the masked DRAM location or at least one read data value read from an unmasked DRAM location does not match a second write data value written to the unmasked DRAM location;
determining a maximum passing PBDS value, the maximum passing PBDS value for each of the plurality of DM signal lines being provided in step (d) during the next iteration of steps (b)-(h) wherein it is determined in step (g) that at least one read data value read from a masked DRAM location does not match a first write data value written to the masked DRAM location and at least one read data value read from an unmasked DRAM location does not match a second write data value written to the unmasked DRAM location, and wherein it was determined in step (g) during the previous iteration of steps (b)-(h) that each read data value read from a masked DRAM location matches a first write data value written to the masked DRAM location and each read data value read from an unmasked DRAM location matches a second write data value written to the unmasked DRAM location; and
determining a mid-point between the minimum passing PBDS value and the maximum passing PBDS value.

18. The system of claim 10, wherein the control logic is further configured to effect the step of setting per-bit de-skew (PBDS) values for data signal lines in the DRAM interface before steps (a)-(i).

19. An integrated circuit having a system for determining per-bit de-skew (PBDS) values for datamask (DM) signal lines in a dynamic random access memory (DRAM) interface, the integrated circuit comprising:
a first write data register configured for storing a plurality of first write data values;
a second write data register configured for storing a plurality of second write data values different from the plurality of first write data values;
a DM register configured for storing a plurality of DM values;
comparator logic; and
control logic configured to effect the steps of:

(a) setting a PBDS value for a DM signal line of the interface;
(b) sequentially providing a plurality of initial DM values to the DRAM memory using the DM signal line, each initial DM value of the plurality of initial DM values representing an unmasked state;
(c) sequentially writing the plurality of first write data values from the first write data register to a corresponding plurality of DRAM locations in synchronism with step (b) using a data signal line group corresponding to the DM signal line, each initial DM value defining an unmasked DRAM location of the plurality of DRAM locations, the interface delaying signals representing the initial DM values on the DM signal line by an amount of time corresponding to the PBDS value;
(d) sequentially providing the plurality of DM values from the DM register to the DRAM memory using the DM signal line, at least one DM value of the plurality of DM values representing a masked state and at least another DM value of the plurality of DM values representing an unmasked state;
(e) sequentially writing the plurality of second write data values from the second write data register to a corresponding plurality of DRAM locations in synchronism with step (d) using the data signal line group corresponding to the DM signal line, each DM value representing a masked state defining a masked DRAM location of the plurality of DRAM locations, each DM value representing an unmasked state defining an unmasked DRAM location of the plurality of DRAM locations, the interface delaying signals representing the DM values on the DM signal line by an amount of time corresponding to the PBDS value;
(f) reading a plurality of read data values from the plurality of DRAM locations following step (e);
(g) the comparator logic determining if each read data value read from a masked DRAM location matches a first write data value written to the masked DRAM location and each read data value read from an unmasked DRAM location matches a second write data value written to the unmasked DRAM location;
(h) setting the PBDS value for the DM signal line to another value; and
(i) iteratively repeating steps (b)-(h) with the PBDS value for the DM signal line set to each of a plurality of different PBDS values within a range of PBDS values.

20. The integrated circuit of claim 19, wherein:
step (a) comprises setting a PBDS value for each of a plurality of DM signal lines of the interface;
step (b) comprises providing a plurality of initial DM value groups;
step (c) comprises writing a plurality of first write data value groups using a plurality of data signal line groups, each data signal line group corresponding to one of the DM signal lines;
step (d) comprises providing a plurality of DM value groups;
step (e) comprises writing a plurality of second write data value groups using the plurality of data signal line groups; and
step (f) comprises reading a plurality of read data value groups.

21. The integrated circuit of claim 19, wherein each first write data value of the plurality of first write data values is the complement of one second write data value of the plurality of second write data values.

22. The integrated circuit of claim 19, wherein the control logic is further configured to effect the step of changing the plurality of DM values provided in step (d) before repeating steps (b)-(h).

23. The integrated circuit of claim 19, wherein the control logic is further configured to effect the step of changing the plurality of first write data values in step (c) before repeating steps (b)-(h).

24. The integrated circuit of claim 19, wherein the control logic is further configured to effect the step of changing the plurality of second write data values in step (e) before repeating steps (b)-(h).

25. The integrated circuit of claim 19, wherein in step (h) setting the PBDS value for the DM signal line to another value comprises incrementing the PBDS value by an increment value during a previous iteration of steps (b)-(h) before a next iteration of steps (b)-(h).

26. The integrated circuit of claim 25, wherein the control logic is further configured to effect the steps of:

determining a minimum passing PBDS value, the minimum passing PBDS value being provided in step (d) during the next iteration of steps (b)-(h) wherein it is determined in step (g) that each read data value read from a masked DRAM location matches a first write data value written to the masked DRAM location and each read data value read from an unmasked DRAM location matches a second write data value written to the unmasked DRAM location, and wherein it was determined in step (g) during the previous iteration of steps (b)-(h) that at least one read data value read from a masked DRAM location does not match a first write data value written to the masked DRAM location or at least one read data value read from an unmasked DRAM location does not match a second write data value written to the unmasked DRAM location;

determining a maximum passing PBDS value, the maximum passing PBDS value for each of the plurality of DM signal lines being provided in step (d) during the next iteration of steps (b)-(h) wherein it is determined in step (g) that at least one read data value read from a masked DRAM location does not match a first write data value written to the masked DRAM location and at least one read data value read from an unmasked DRAM location does not match a second write data value written to the unmasked DRAM location, and wherein it was determined in step (g) during the previous iteration of steps (b)-(h) that each read data value read from a masked DRAM location matches a first write data value written to the masked DRAM location and each read data value read from an unmasked DRAM location matches a second write data value written to the unmasked DRAM location; and determining a mid-point between the minimum passing PBDS value and the maximum passing PBDS value.

27. The integrated circuit of claim 19, wherein the control logic is further configured to effect the step of setting per-bit de-skew (PBDS) values for data signal lines in the DRAM interface before steps (a)-(i).

* * * * *